United States Patent
Tromp

(10) Patent No.: US 7,348,566 B2
(45) Date of Patent: Mar. 25, 2008

(54) ABERRATION-CORRECTING CATHODE LENS MICROSCOPY INSTRUMENT

(75) Inventor: Rudolf M. Tromp, North Salem, NY (US)

(73) Assignee: International Business Machines Corporation, Armonk, NY (US)

( * ) Notice: Subject to any disclaimer, the term of this patent is extended or adjusted under 35 U.S.C. 154(b) by 230 days.

(21) Appl. No.: 11/364,299

(22) Filed: Feb. 28, 2006

(65) Prior Publication Data
US 2007/0200070 A1 Aug. 30, 2007

(51) Int. Cl.
*G01J 1/42* (2006.01)
(52) U.S. Cl. .................. 250/396 R; 250/305; 250/310
(58) Field of Classification Search ............ 250/396 R
See application file for complete search history.

(56) References Cited

U.S. PATENT DOCUMENTS

| | | | | |
|---|---|---|---|---|
| 5,319,207 A * | 6/1994 | Rose et al. | ............. | 250/396 R |
| 5,336,885 A * | 8/1994 | Rose et al. | ................. | 250/305 |
| 6,855,939 B2 * | 2/2005 | Rose et al. | ............. | 250/396 R |

FOREIGN PATENT DOCUMENTS

WO PCT/US2007/062101 8/2007

OTHER PUBLICATIONS

W.P. Skoczylas et al., "Electron Optical Benches for In-Line and Branches Systems A New Bench Designed for Mirror-Based Aberration Correction and Low Energy Electron Microscopy," Review of Scientific Instruments, Oct. 1994, 3183-3193, vol. 65, No. 10, New York.

G.F. Rempfer et al., "Correction of Chromatic Aberration with an Electron Mirror," Optik, Nov. 1992, pp. 3-8, vol. 92, No. 1, Germany.

(Continued)

*Primary Examiner*—Jack I. Berman
*Assistant Examiner*—Phillip A. Johnson
(74) *Attorney, Agent, or Firm*—Ido Tuchman; Ryan, Mason & Lewis, LLP

(57) ABSTRACT

An aberration-correcting microscopy instrument is provided. The instrument has a first magnetic deflector disposed for reception of a first non-dispersed electron diffraction pattern. The first magnetic deflector is also configured for projection of a first energy dispersed electron diffraction pattern in an exit plane of the first magnetic deflector. The instrument also has an electrostatic lens disposed in the exit plane of a first magnetic deflector, as well as a second magnetic deflector substantially identical to the first magnetic deflector. The second magnetic deflector is disposed for reception of the first energy dispersed electron diffraction pattern from the electrostatic lens. The second magnetic deflector is also configured for projection of a second non-dispersed electron diffraction pattern in a first exit plane of the second magnetic deflector. The instrument also has an electron mirror configured for correction of one or more aberrations in the second non-dispersed electron diffraction pattern. The electron mirror is disposed for reflection of the second non-dispersed electron diffraction pattern to the second magnetic deflector for projection of a second energy dispersed electron diffraction pattern in a second exit plane of the second magnetic deflector.

21 Claims, 9 Drawing Sheets

OTHER PUBLICATIONS

G.F. Rempfer et al., "A Theoretical Study of the Hyperbolic Electron Mirror as a Correcting Element for Spherical and Chromatic Aberration in Electron Optics," Journal of Applied Physics, May 1990, pp. 6027-6040, vol. 67, No. 10, New York.

L. Reimer, "Transmission Electron Microscopy," Physics of Image Formation and Mircoanalysis, 1984, p. 115, Tokyo.

H. Spiecker et al., "Time-of-Flight Photoelectron Emission Microscopy TOF-PEEM: First Results," Nuclear Instruments & Methods in Physics Research, Section A, Apr. 1998, pp. 499-506, vol. 406, Netherlands.

W.P. Skoczylas et al., "A Proposed Modular Imaging System for Photelectron and Electron Probe Microscopy with Aberration Correction, and for Mirror Microscopy and Low-Energy Electron Microscopy." Ultramicroscopy, XP-002445438, 1991, pp. 252-261, vol. 36, North Holland.

L.H. Veneklasen, "The Continuing Development of Low-Energy Electron Microscopy for Characterizing Surfaces," Review of Scientific Instruments, Dec. 1992, pp. 5513-5532, vol. 63, No. 12, New York.

W. Wan et al., "Simulation of a Mirror Corrector for PEEM3," Nuclear Instruments & Methods in Physics Research, Section A, 2004, pp. 222-229, vol. 519, Netherlands.

H. Rose et al., "Outline of a Versatile Corrected LEEM," Optik, Nov. 1992, pp. 31-44, vol. 92, No. 1, Germany.

* cited by examiner

FIG. 2
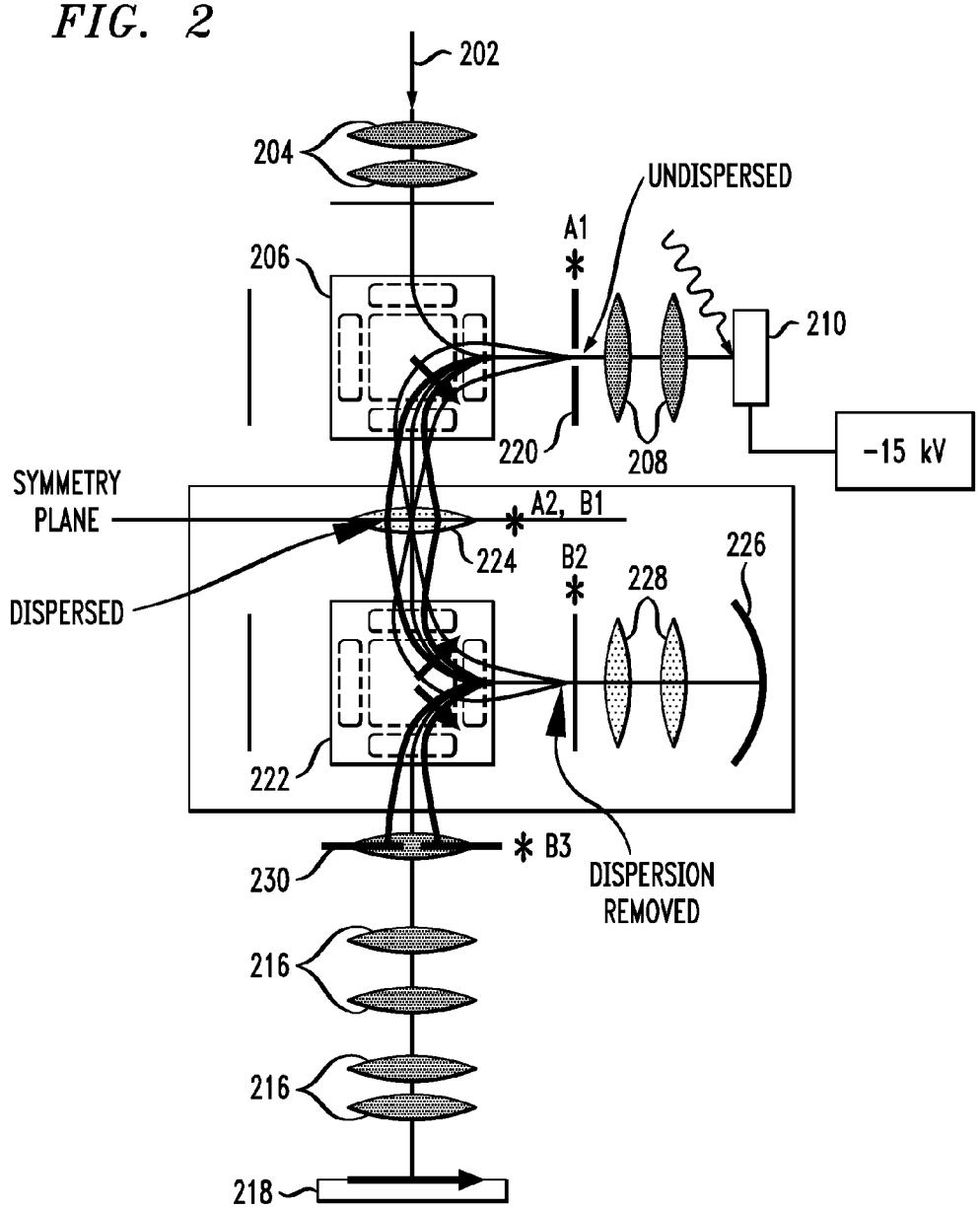
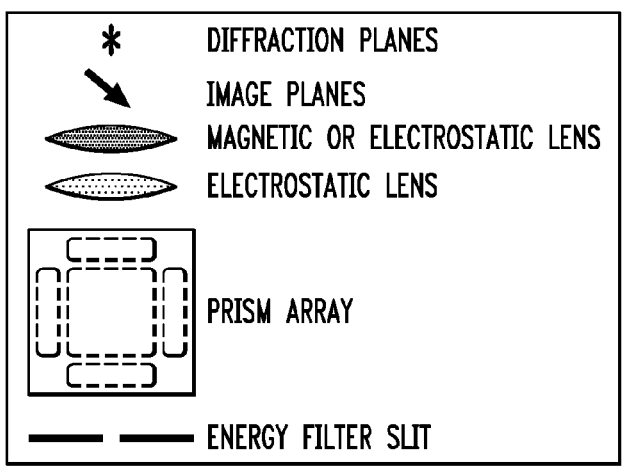

STRAIGHT COLUMN

OBJECTIVE LENS

* DIFFRACTION PLANES
↘ IMAGE PLANES
◇ MAGNETIC OR ELECTROSTATIC LENS
◇ ELECTROSTATIC LENS
□ PRISM ARRAY
— ENERGY FILTER SLIT

FIG. 9
MIRROR CORRECTOR
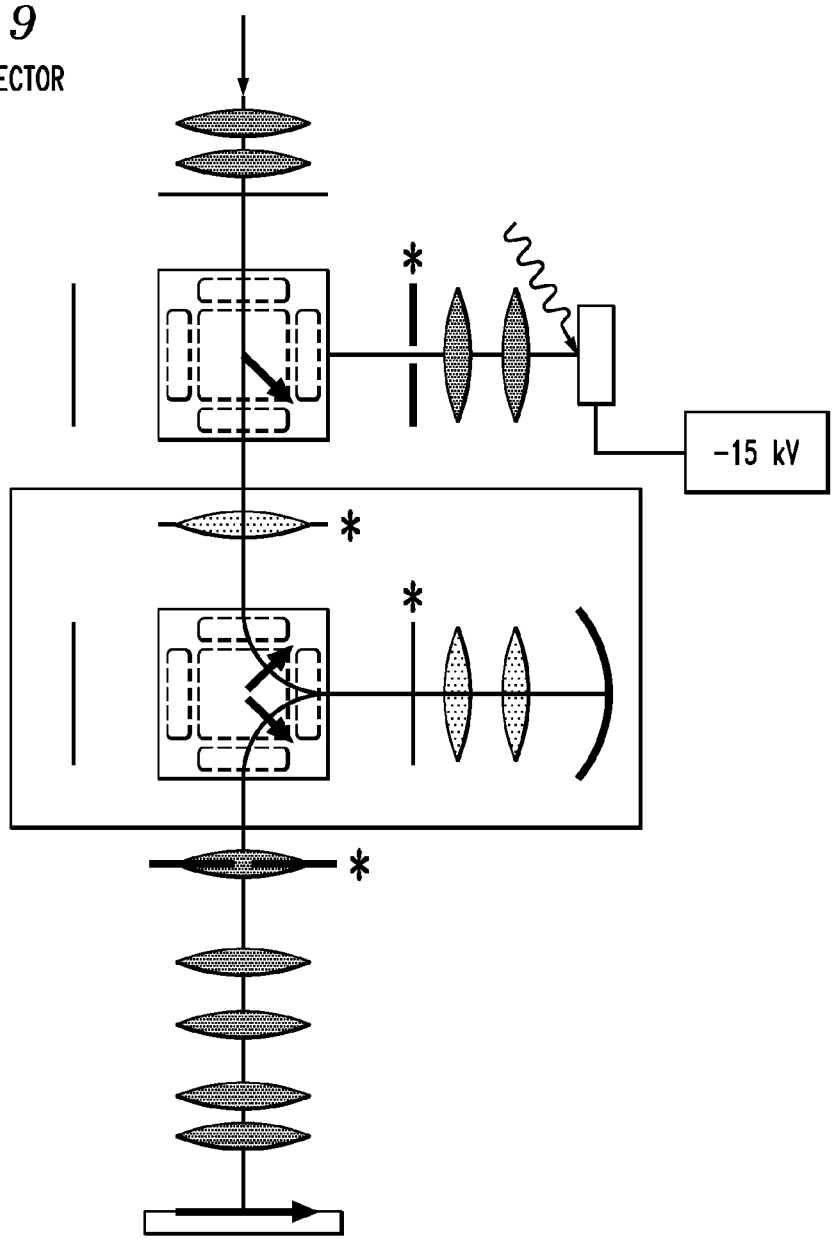
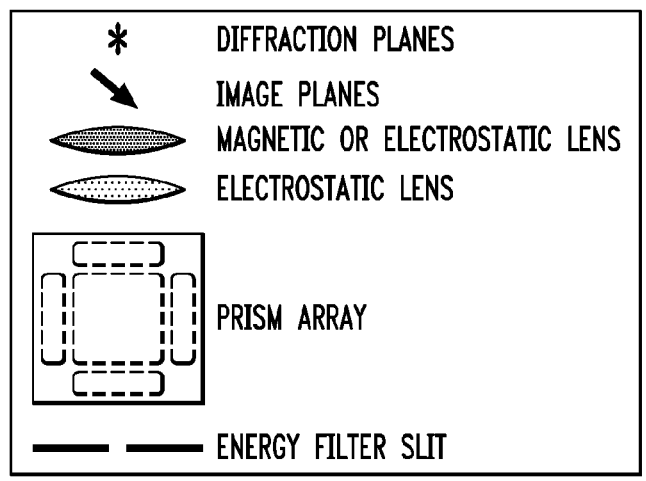
\*    DIFFRACTION PLANES
↘    IMAGE PLANES
MAGNETIC OR ELECTROSTATIC LENS
ELECTROSTATIC LENS
PRISM ARRAY
— — ENERGY FILTER SLIT

ABERRATION-CORRECTING CATHODE LENS MICROSCOPY INSTRUMENT

CROSS REFERENCE TO RELATED APPLICATIONS

This application is related to the U.S. patent application Ser. No. 11/364,298, entitled "Energy-Filtering Cathode Lens Microscopy Instrument," which is filed concurrently herewith and incorporated by reference herein.

FIELD OF THE INVENTION

The present invention relates generally to electron microscopy and, more particularly, to a simplified aberration-correcting electron microscopy instrument.

BACKGROUND OF THE INVENTION

Low energy electron microscopy (LEEM) and photo electron emission microscopy (PEEM) are both examples of cathode lens microscopy, in which a strong electric field is maintained between a sample under study and an objective lens of a microscope. In such instruments, the sample is considered the cathode and the objective lens is considered the anode. Electrons are reflected from the sample in the case of a LEEM instrument, or photo-emitted by the sample in the case of a PEEM instrument, at low energy, for example, less than 500 eV. The electrons are accelerated into the objective lens, reaching an energy of 10-30 keV. Subsequently, these electrons are utilized to form an image of the sample on a viewing screen.

The backfocal plane of the objective lens of the microscopy instrument provides an image of the angular distribution of the electrons, which contains information on the arrangement of the atoms in the outer layers of the sample. This image is considered a low energy electron diffraction (LEED) pattern for LEEM, or a photo electron diffraction (PED) pattern for PEEM. The energy distribution of these electrons may also contain information about the electronic and chemical nature of the surface under study.

Energy filtering of the electrons allows an operator to view an image of the sample at a specified electron energy corresponding to, for example, the binding energy of electrons of a particular chemical element. Alternatively, by operating projector and spectrometer lenses of the microscope at a different excitation, the energy filtered PED pattern may be observed. The operator may choose to record an energy spectrum of the photo emitted electrons. The combination of an energy filtering cathode lens microscopy instrument with synchrotron radiation provides the operator with an extremely powerful analytical tool in the study of surface and interface structure and composition.

Aberration-corrected energy-filtered LEEM/PEEM has been pursued by several research groups. In general, the experimental approaches taken are quite complex, and include, for example, a dispersion-free prism array as outlined by Rose and Preikszas for the German SMART project, as well as the Berkeley-based PEEM project. In such an approach, energy filtering is accomplished through the inclusion of an omega energy filter in the projection column. Aberration correction is accomplished through the inclusion of an electron mirror on one of the four faces of the dispersion-free prism array. The dispersion-free prism array, the electron mirror, and the omega filter are electron optical components of high complexity. Combining all three elements in a single microscopy instrument has proven to be a non-trivial exercise in instrument design and construction. Therefore, it is desirable to achieve a novel instrument geometry that relies on a simpler prism array allowing dispersion, and which allows for a simplified incorporation of energy-filtering and aberration-correcting functions.

SUMMARY OF THE INVENTION

The present invention provides a simplified aberration-correcting cathode lens microscopy instrument, more specifically a simplified aberration-correcting combined LEEM/PEEM instrument.

For example, in one aspect of the present invention, an aberration-correcting microscopy instrument is provided. The instrument has a first magnetic deflector disposed for reception of a first non-dispersed electron diffraction pattern. The first magnetic deflector is also configured for projection of a first energy dispersed electron diffraction pattern in an exit plane of the first magnetic deflector. The instrument also has an electrostatic lens disposed in the exit plane of a first magnetic deflector, as well as a second magnetic deflector substantially identical to the first magnetic deflector. The second magnetic deflector is disposed for reception of the first energy dispersed electron diffraction pattern from the electrostatic lens. The second magnetic deflector is also configured for projection of a second non-dispersed electron diffraction pattern in a first exit plane of the second magnetic deflector. The instrument also has an electron mirror configured for correction of one or more aberrations. The electron mirror is disposed for reflection of the second non-dispersed electron diffraction patter to the second magnetic deflector for projection of a second energy dispersed electron diffraction pattern in a second exit plane of the second magnetic deflector.

In this embodiment of the present invention, the exit plane of the first magnetic deflector, the second magnetic deflector, the first exit plane of the second magnetic deflector, and the second exit plane of the second magnetic deflector are disposed for unit magnification. Further, the microscopy instrument may also have an auxiliary electrostatic lens system disposed to focus the non-dispersed electron diffraction pattern onto the mirror surface for aberration correction, and refocus it again onto the first exit plane of the second magnetic deflector after aberration correction in the electron mirror upon return to the second magnetic deflector. The microscopy instrument may include an objective lens disposed for reception of electrons in order to from an electron diffraction pattern in a backfocal plane of the objective lens that coincides with an entrance plane for the first magnetic deflector.

Additionally, the microscopy instrument may have an entrance aperture disposed in the backfocal plane of the objective lens and entrance plane of the first magnetic deflector for filtering a slice of the electron diffraction pattern, as well as an exit aperture disposed in the second exit plane of the second magnetic deflector for selection of desired electron energy of the energy dispersed electron diffraction pattern. Finally, the microscopy instrument may include a projection column disposed to receive and magnify an electron diffraction pattern, as well as a viewing screen for projection of the magnified electron energy diffraction pattern from the projection column.

In another aspect of the present invention, a method of correcting aberration in an electron microscopy instrument is provided.

These and other objects, features and advantages of the present invention will become apparent from the following detailed description of illustrative embodiments thereof, which is to be read in connection with the accompanying drawings.

BRIEF DESCRIPTION OF THE DRAWINGS

FIG. 2 is a diagram illustrating an aberration-correcting energy-filtering LEEM/PEEM instrument, according to an embodiment of the present invention;

FIG. 9 is a diagram illustrating an aberration-correcting energy-filtering LEEM/PEEM instrument with a second magnetic deflector activated, according to an embodiment of the present invention.

DETAILED DESCRIPTION OF PREFERRED EMBODIMENTS

As will be illustrated in detail below, the present invention introduces a simplified aberration-correcting cathode lens microscopy instrument. The novel microscopy instrument layout and geometry of the embodiments of the present invention significantly simplifies the task of aberration correction by replacing previously proposed electron optical components with a simpler device.

Figure 1:
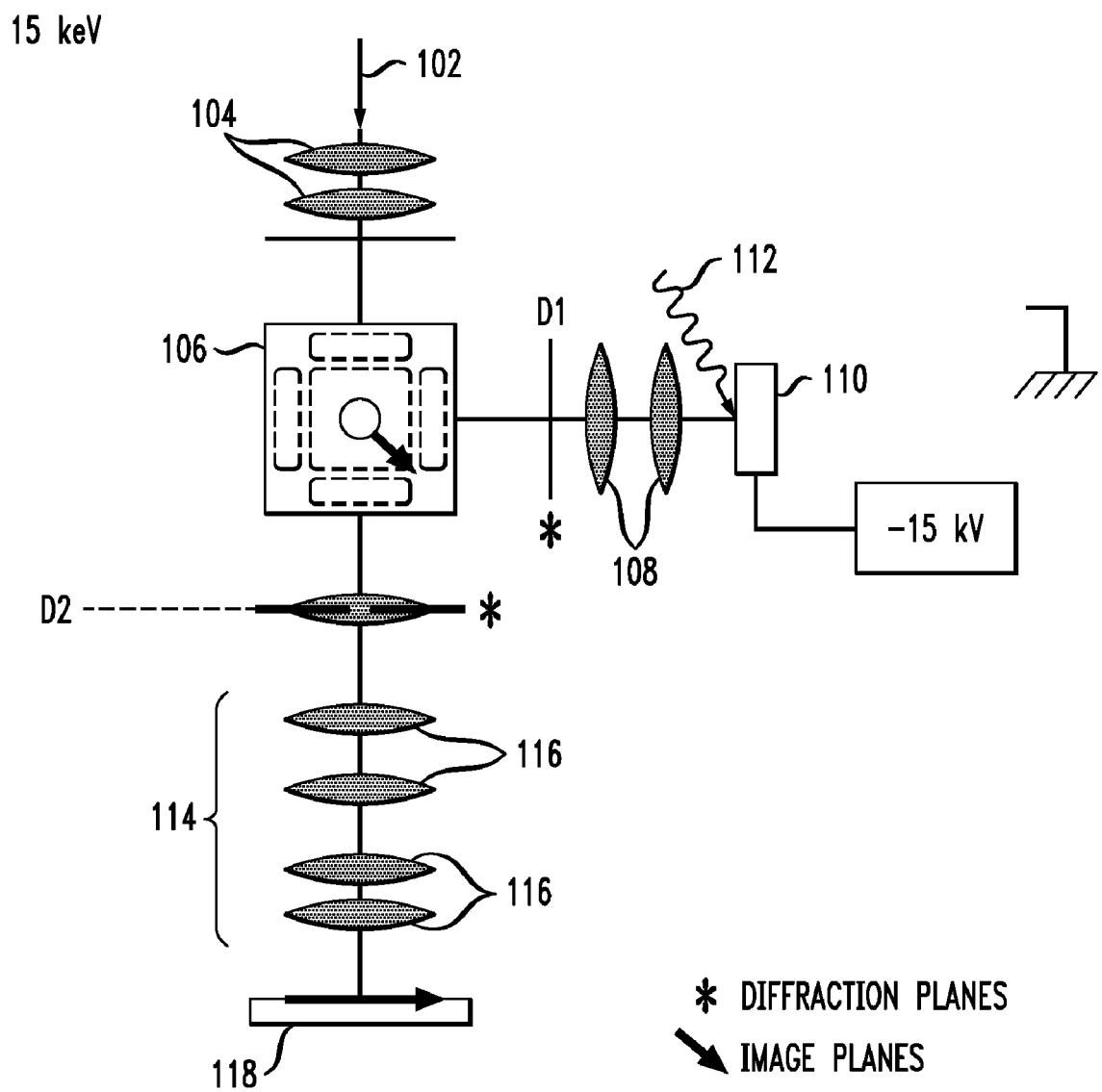
FIG. 1 is a diagram illustrating an LEEM/PEEM instrument without aberration correction.

Referring initially to FIG. 1, a diagram illustrates a LEEM/PEEM instrument without aberration correction or energy filtering. In a LEEM instrument, an electron gun generates an electron beam 102 at, for example, 15 keV electron energy. Condenser lenses 104 focus electron beam 102 into a magnetic deflector 106 having a specified prism array. Magnetic deflector 106 consists of two parallel plates, between which the electrons are deflected. Each plate of magnetic deflector 106 preferably contains at least one, but preferably five electromagnets. Magnetic deflector 106 deflects electron beam 102 over a large angle, for example, 90 degrees in this embodiment, thereby directing electron beam 102 to an objective lens system 108 for reflection from a sample 110.

Alternatively, in a PEEM instrument, sample 110 may be illuminated with ultra violet (UV) light or soft X-ray photos 112 to generate photo electrons from sample 110. In this embodiment, an electron gun is not utilized.

Electrons from sample 110 form a diffraction pattern in a backfocal plane of objective lens system 108, as well as a real space image of sample 110 in a diagonal plane of the prism array of magnetic deflector 106.

Outside of magnetic deflector 106 exist four symmetric planes of special significance. An object placed in plane D1 of magnetic deflector 106 is transferred at unit magnification to plane D2 of magnetic deflector 106. The backfocal plane of objective lens system 108 is positioned to coincide with plane D1, enabling a diffraction pattern to be observed in plane D2. A real space magnified image of the sample is placed on the diagonal of magnetic deflector 106. This diagonal plane is achromatic. The diffraction pattern is energetically dispersed in plane D2, and not achromatic.

A projector column 114 contains lenses 116 for magnification of the image from the diagonal plane of magnetic deflector 106 or the diffraction pattern from plane D2 of magnetic deflector 106 onto a viewing screen 118.

Referring now to FIG. 2, a diagram illustrates an aberration-correcting energy-filtering LEEM/PEEM instrument, according to an embodiment of the present invention. In a LEEM instrument, an electron gun generates an electron beam 202 as described above. Condenser lenses 204 and a magnetic field in a first magnetic deflector 206 also act in similar fashions to FIG. 1. The deflection of electron beam 202 directs it into an objective lens system 208 and to a sample 210. After a reflection of electron beam 202 from sample 210, the electrons retrace their path to a final kinetic energy, preferably in the range 10-30 keV, forming a LEED pattern in a backfocal plane of objective lens system 208. Alternatively, a PEEM instrument may be utilized to generate a PED pattern in backfocal plane as described above.

Backfocal plane of objective lens system 208 is positioned to coincide with plane A1 of first magnetic deflector 206, enabling a real space image to be formed on a diagonal of first magnetic deflector 206, and a diffraction pattern to be observed in plane A2 of first magnetic deflector 206 at unit magnification. Planes A1 and A2 are each equidistant from the center of first magnetic deflector 206, and are related to each other by 1:1 image transfers, by 90 degree deflection through the prism upon proper excitation of the array elements.

Energy filtering of the real space image is partially provided through the placement of a suitable entrance slit 220 in plane A1, preferably taking a slice across the diffraction pattern. The width of entrance slit 220 will determine the achievable energy resolution in plane A2. In plane A2 the slice is reimaged by the prism array of first magnetic deflector 206 and also dispersed in energy.

The prism array of first magnetic deflector 206 is of a simple, proven design that is easy to manufacture. It is double focusing for both image and diffraction planes. The image plane, located on the diagonal is preferably achromatic in this embodiment of the present invention. The diffraction plane, for the prism dimensions used has a dispersion of approximately 6 micrometer/eV in this embodiment of the present invention, sufficient for energy filtering and spectroscopy purposes.

Figure 3:
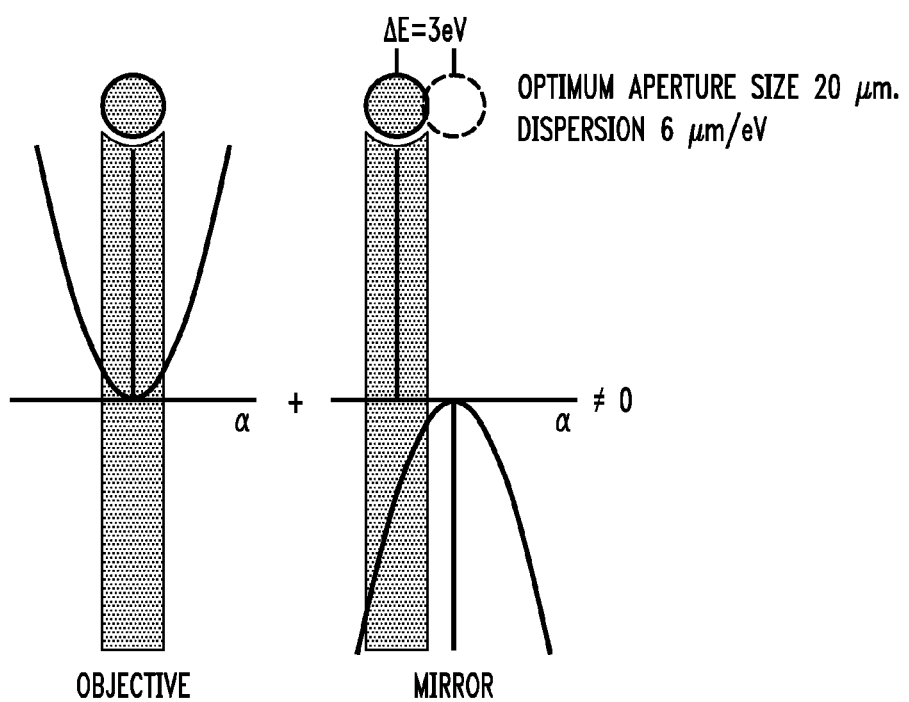
FIG. 3 is a diagram illustrating aberration correction with dispersion, according to an embodiment of the present invention.
Figure 4:
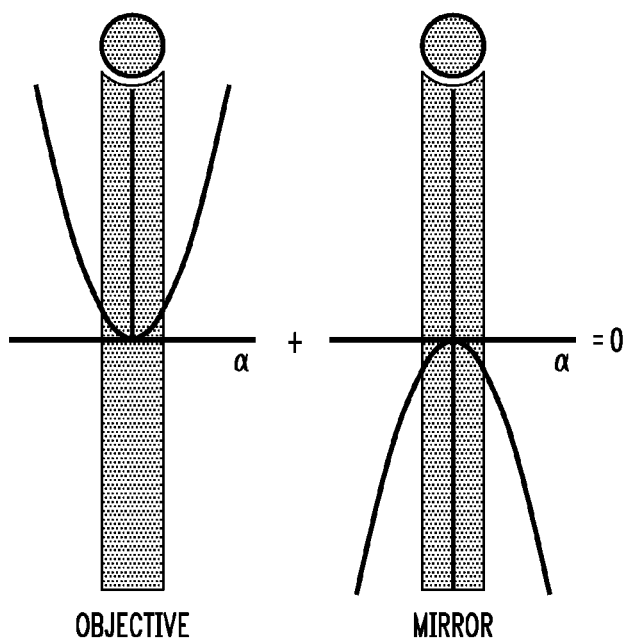
FIG. 4 is a diagram illustrating aberration correction without dispersion, according to an embodiment of the present invention.

In principle, one could attempt to correct spherical and chromatic aberration by placing an electron mirror at the bottom face of first magnetic deflector 206 below plane A2, following the teachings of the SMART project of Rose and Preikszas. However, the energy dispersion in plane A2 makes correction impractical. For example, referring now to FIG. 3, a diagram illustrates aberration correction with dispersion, according to an embodiment of the present invention. When there is dispersion, the dispersed rays are not corrected. Instead, combination aberrations are introduced that are larger than the original aberrations. Further, referring now to FIG. 4, a diagram illustrates aberration correction in the absence of dispersion, according to an embodiment of the present invention. Without dispersion, the aberrations of the mirror can correct the aberrations of the objective lens.

Therefore, referring back to FIG. 2, a second magnetic deflector 222, substantially identical to first magnetic deflector 206, is disposed below first magnetic deflector 206 such that plane A2 of first magnetic deflector 206 coincides with plane B1 of second magnetic deflector 220. Additionally, an electrostatic lens 224 centered on the A2/B1 plane transfers the sample image from the diagonal plane of first magnetic deflector 206 onto the diagonal plane of second magnetic deflector 222 at unit magnification. After a 90 degree deflection through second magnetic deflector 222, the electron diffraction pattern is once again free from energy dispersion in plane B2 of second magnetic deflector 222, by virtue of symmetry.

The embodiment of the present invention described above utilizes two substantially identical prism arrays or magnetic deflectors, separated by a simple electrostatic einzel lens operating at fixed focal length. An electrostatic lens is chosen, rather than a magnetic lens, to keep the image transfer rotation-free. Image rotation would spoil the cancellation of energy dispersion that results after the first 90 degree deflection by second magnetic deflector 222, setting up the proper ray paths to enter the electron mirror for aberration correction.

An electron mirror 226, positioned beyond plane B2 of second magnetic deflector 222 corrects for both chromatic and spherical aberration. An auxiliary electrostatic lens system 228 between second magnetic deflector 222 and electron mirror 226 is set up to focus the electron diffraction pattern in plane B2 after aberration correction, and to focus the image on the diagonal plane of second magnetic deflector 222. After a second 90 degree deflection through second magnetic deflector 222, the electron diffraction pattern is re-imaged by the prism array of second magnetic deflector 222 in plane B3, where the energy spectrum is once again dispersed. An exit aperture 228 in plane B3 is positioned to select a desired electron energy, and projector lenses 216 magnify the energy filtered real space image of sample 210 onto a viewing screen 218.

Figure 5:
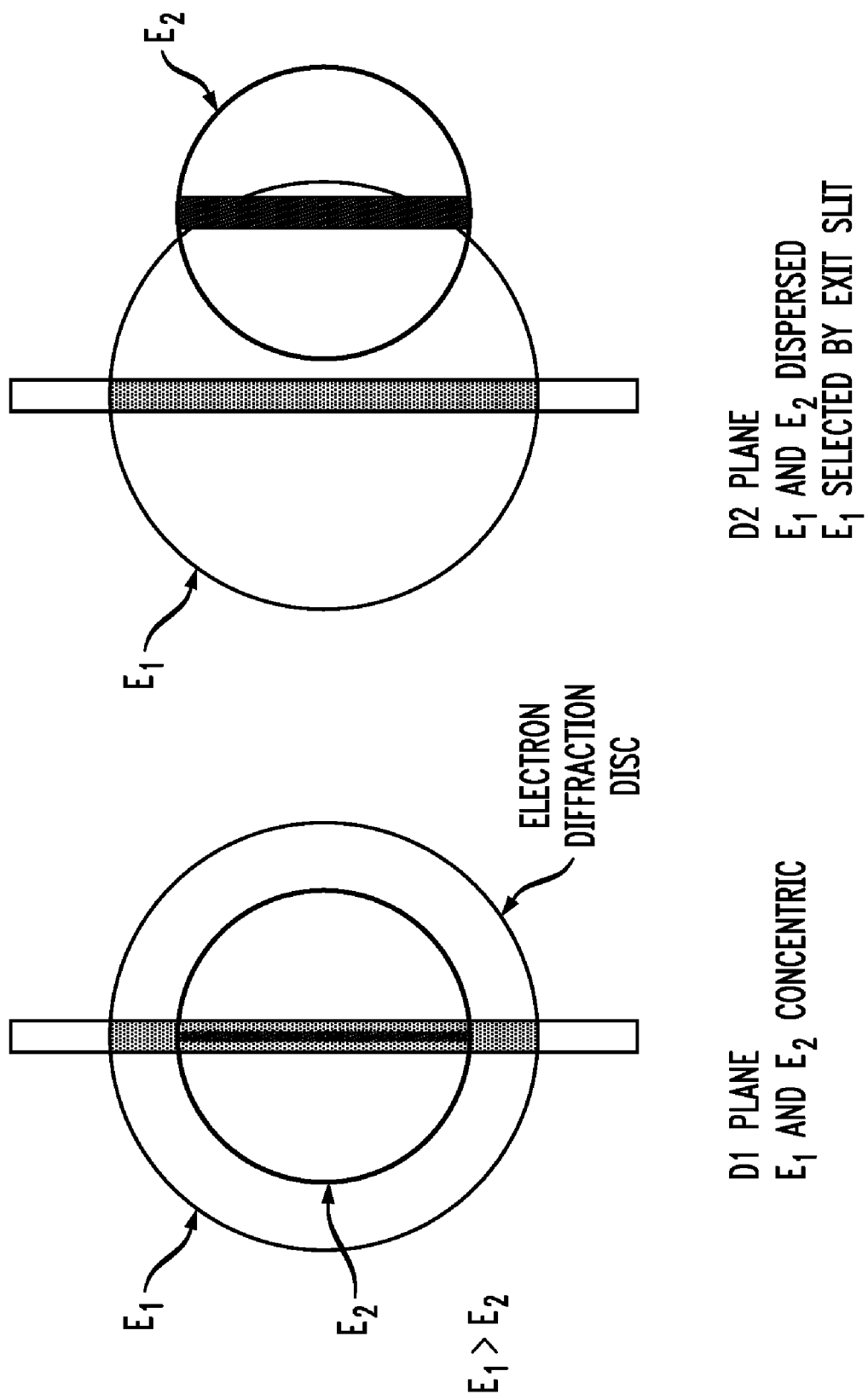
FIG. 5 is a diagram illustrating discrete energies at planes A1 and B3 of the LEEM/PEEM instrument of FIG. 2, according to an embodiment of the present invention.

In the embodiment of the present invention shown in FIG. 2, an energy filtered diffraction pattern can be obtained without changing any of the lens settings, other than the diffraction lens in the projection column, which switches between diffraction and image plane in the usual fashion. Referring now to FIG. 5, a diagram illustrates discrete energies at planes A1 and B3 of the electron microscopy instrument, according to an embodiment of the present invention. FIG. 5 assumes for simplicity that the energy spectrum of the electrons contains only two discrete energies $E_1$ and $E_2$, with $E_1 > E_2$. Due to the difference in energy the electron diffraction disc at $E_1$ is larger than at $E_2$. In the backfocal plane of the objective lens, plane A1 in FIG. 2, these two discs are concentric. In plane B3 of FIG. 2, due to energy dispersion, $E_2$ is displaced relative to $E_1$. An aperture placed in plane A1 gives rise to the presence of two lines of intensity in plane B3, corresponding to $E_1$ and $E_2$.

Figure 6:
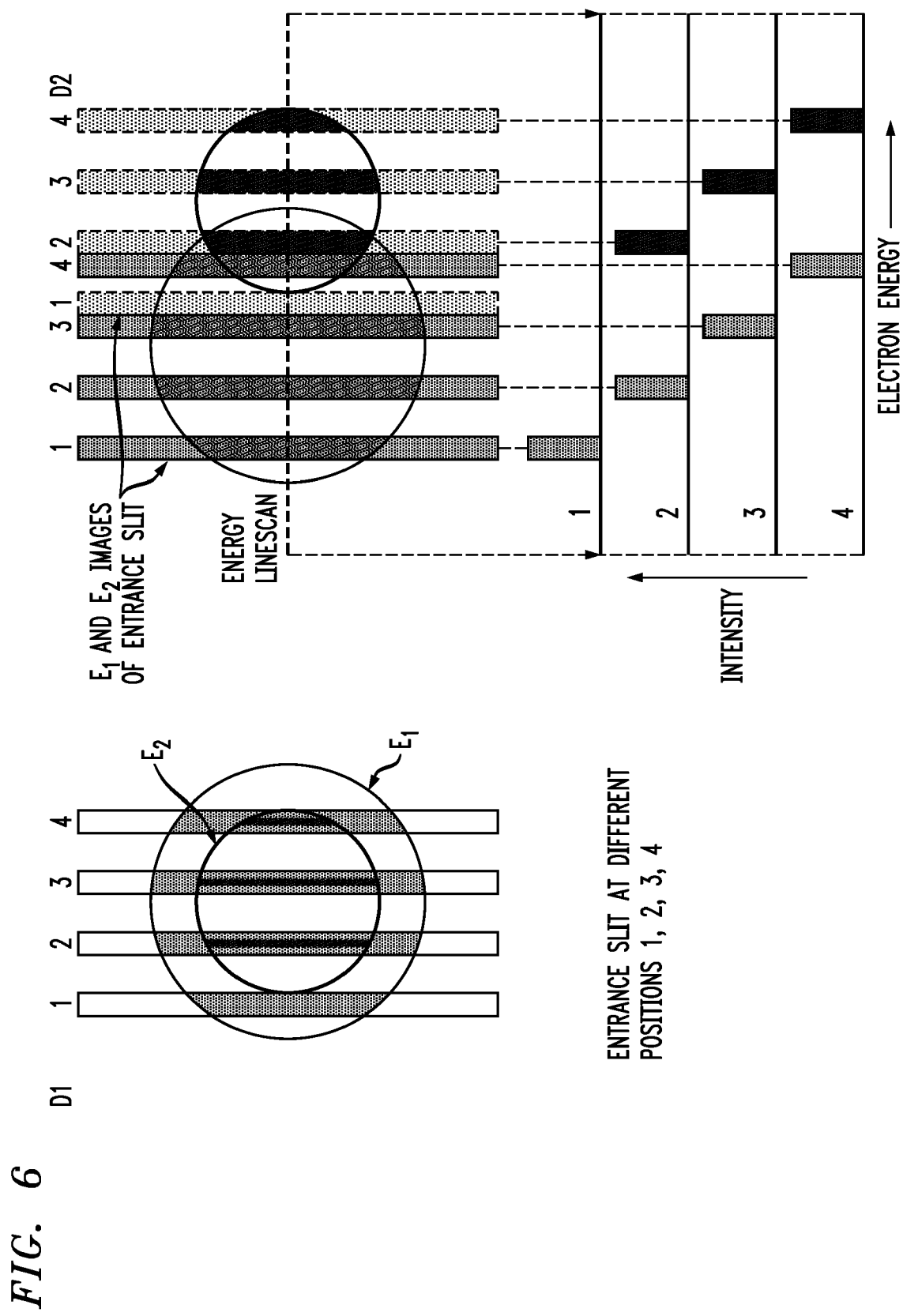
FIG. 6 is a diagram illustrating discrete energies at planes A1 and B3 of the LEEM/PEEM instrument of FIG. 2 for different entrance aperture positions, according to an embodiment of the present invention.

Referring now to FIG. 6, a diagram illustrates discrete energies at planes A1 and B3 of the electron microscopy instrument for different entrance aperture positions, according to an embodiment of the present invention. As the aperture in plane A1 is scanned across the diffraction discs, the dispersed lines corresponding to $E_1$ and $E_2$ are also scanned across B3. The projector lenses project B3 onto the viewing screen. As the entrance aperture is scanned across plane A1 the dispersed image of the slice in B3 may be recorded from the viewing screen with a video acquisition system, one image for each position of the entrance aperture. The complete diffraction discs for $E_1$ and $E_2$ can easily be reconstructed from these video recordings by digital computer, for both $E_1$ and $E_2$.

Microscope alignment is greatly simplified by the embodiment of the present invention provided above. Energy filtering requires only insertion of an appropriate slit in plane A1 and an appropriate aperture in plane B3, rather than deflection of the electron beam through a complex omega filter. With second magnetic deflector 222 turned off, the electrons will travel straight down into the projector column, enabling alignment of first magnetic deflector 206 alone. When first magnetic deflector 206 is aligned, second magnetic deflector 222 may be activated in two steps. First, 90 degree deflection is established by detecting electron beam 202 by passing it through an axial through-hole in electron mirror 226. Second, electron mirror 226 is activated, and electron beam 202 will be reflected back into second magnetic deflector 222 where it will undergo a second 90 degree deflection, so that the beam is once again directed into the projector column. Note that first magnetic deflector 206 and second magnetic deflector 222 may be aligned and activated separately.

Figure 7:
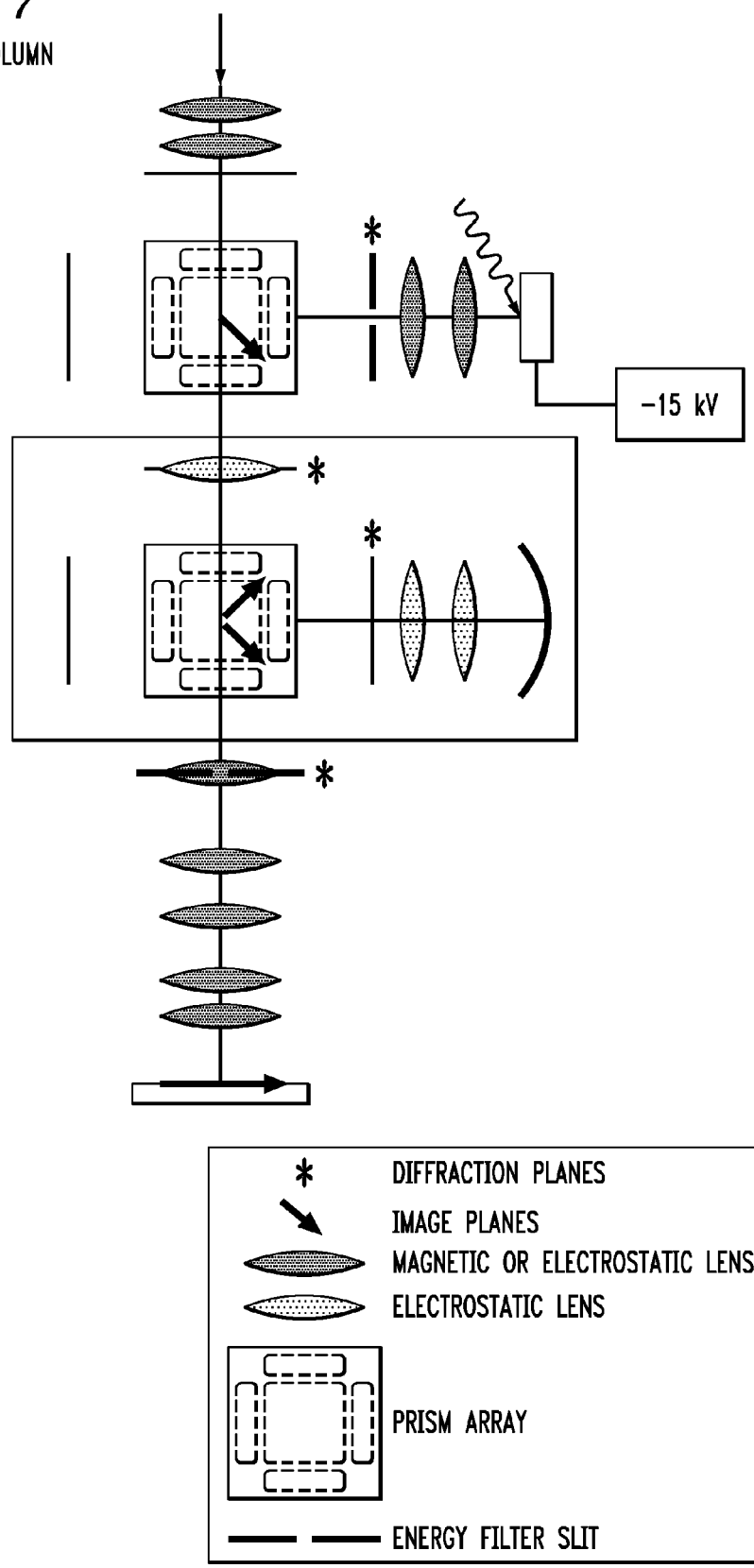
FIG. 7 is a diagram illustrating an aberration-correcting energy-filtering LEEM/PEEM instrument with neither magnetic deflector activated, according to an embodiment of the present invention.

Referring now to FIG. 7, a diagram illustrates an aberration-correcting energy-filtering LEEM/PEEM instrument with neither magnetic deflector activated, according to an embodiment of the present invention. Such an activation configuration of the instrument would result in neither aberration correction nor energy filtering. This mode of operation is selected to align the electron gun, condenser lenses, electrostatic lens and projector lenses, in a straight-column geometry, without the added complexity of deflections by first magnetic deflector 206 and second magnetic deflector 222.

Figure 8:
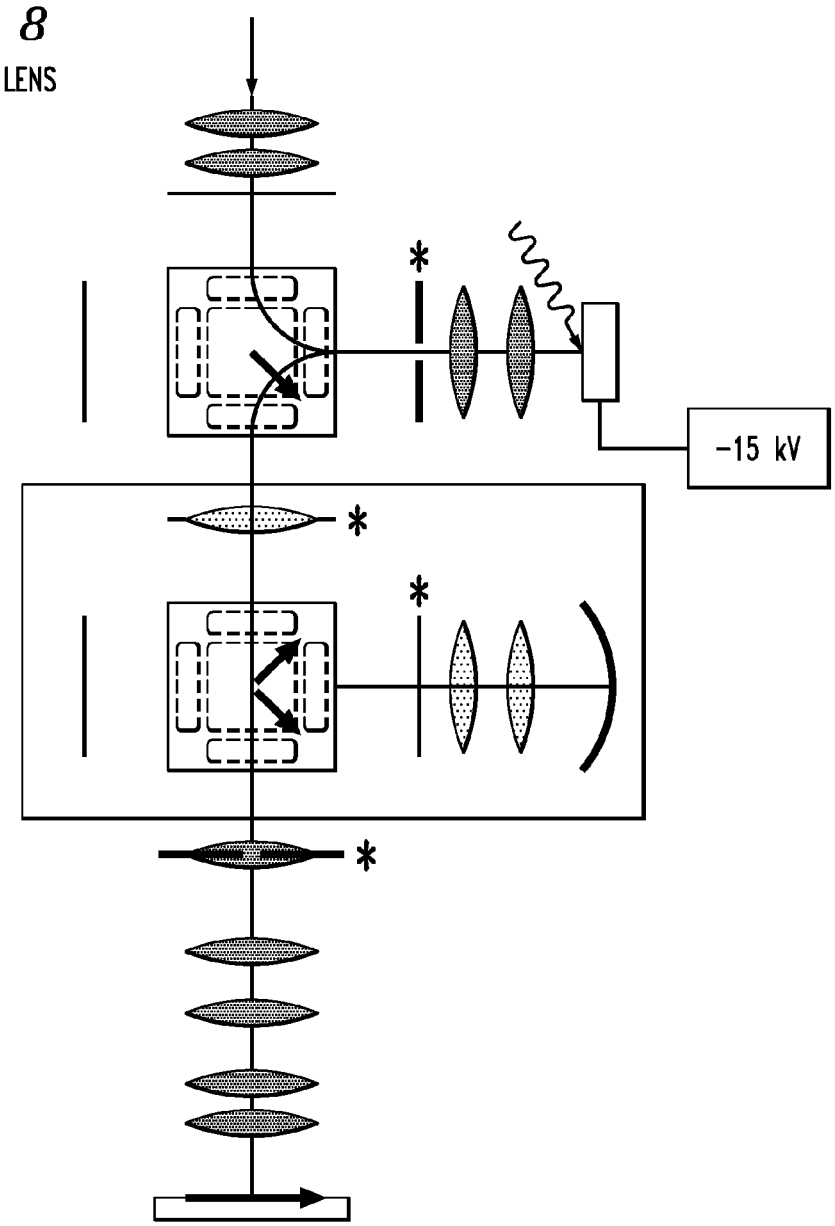
FIG. 8 is a diagram illustrating an aberration-correcting energy-filtering LEEM/PEEM instrument with a first magnetic deflector activated, according to an embodiment of the present invention.

Referring now to FIG. 8, a diagram illustrates an aberration-correcting energy-filtering LEEM/PEEM instrument with a first magnetic deflector activated, according to an embodiment of the present invention. Such an activation of the instrument would enable only energy filtering and not aberration correction. This mode of operation is selected to align first magnetic deflector 206 and objective lens systems relative to the straight column geometry of FIG. 8.

Referring now to FIG. 9, a diagram illustrates an aberration-correcting energy-filtering LEEM/PEEM instrument with a second magnetic deflector activated, according to an embodiment of the present invention. Such an activation of the instrument would enable only alignment of second magnetic deflector 222 and electron mirror optics, relative to the straight column geometry of FIG. 8.

Figure 10:
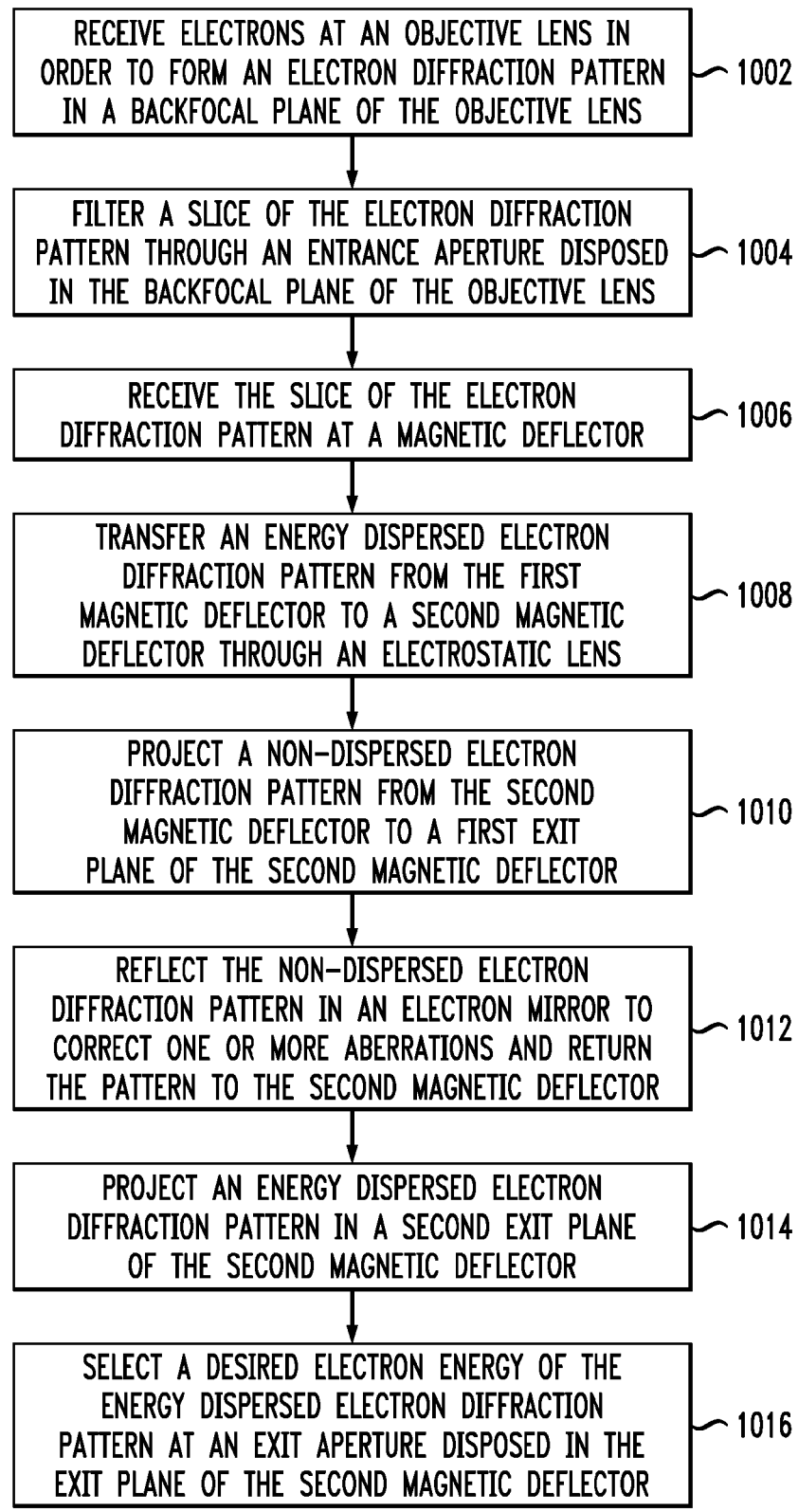
FIG. 10 is a flow diagram illustrating an aberration-correction and energy-filtering methodology for a microscopy instrument, according to an embodiment of the present invention.

Referring now to FIG. 10, a flow diagram illustrates an energy-filtering aberration-correcting methodology for electron microscopy instruments, according to an embodiment of the present invention. The methodology begins in block 1002 where electrons are received at an objective lens in order to form an electron diffraction pattern in a backfocal plane of the objective lens. In block 1004, a slice of the electron diffraction pattern is filtered at an entrance aperture disposed in the backfocal plane of the objective lens. In block 1006, the slice of the electron diffraction pattern is received at a first magnetic deflector. The first magnetic deflector has an entrance plane and an exit plane. The entrance plane coincides with the entrance aperture.

In block 1008, an energy dispersed electron diffraction pattern is transferred from a first magnetic deflector to a second magnetic deflector through an electrostatic lens disposed in an exit plane of the first magnetic deflector and an entrance plane of the second magnetic deflector. The second magnetic deflector is substantially identical to the first magnetic deflector.

In block 1010, a non-dispersed electron diffraction pattern is projected from the second magnetic deflector to a first exit plane of the second magnetic deflector. In block 1012, the non-dispersed electron diffraction pattern is reflected in an electron mirror to correct one or more aberrations and return the nondispersed electron diffraction pattern to the second magnetic deflector.

In block 1014 an energy dispersed electron diffraction pattern is projected in a second exit plane of the second magnetic deflector. Finally, in block 1016, a desired electron energy of the energy dispersed electron diffraction pattern is selected at an exit aperture disposed in the exit plane of the second magnetic deflector terminating the methodology.

The embodiment of the present invention described above allows the electron column to maintain a vertical orientation, which is beneficial for mechanical stability reasons. Furthermore, the gun-to-screen axis remains a single straight line, greatly easing alignment of the key electron-optical components, including the condenser lens system, the prism-to-prism transfer lens, and the projector lens system.

Cancellation of the electron energy dispersion between first magnetic deflector 206 and second magnetic deflector 222 does not rely on subtle electron optical design with extremely stringent requirements on mechanical and magnetic field tolerances, but on a simple and robust symmetry in electron beam deflection. The deflection in second magnetic deflector 222 cancels the dispersion generated by the deflection in first magnetic deflector 206.

The embodiment of the present invention does not require a total redesign of the electron optical column. The second magnetic deflector is substantially identical to the first magnetic deflector. Energy filtering is accomplished by adding a single adjustable energy defining aperture strip to the system in plane A1, and an energy selection aperture in plane B3. This latter aperture also functions as the objective aperture. Only the electrostatic transfer lens and the electron mirror system need to be designed to realize the aberration correction function.

Finally, the embodiment of the present invention described above has a high level of modularity. Both energy filtering and aberration correction can be retrofitted to the standard LEEM instrument by addition of the necessary components, without the need to modify other parts of the electron optical column.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. An aberration-correcting microscopy instrument comprising:
    a first magnetic deflector disposed for reception of a first non-dispersed electron diffraction pattern and configured for projection of a first energy dispersed electron diffraction pattern in an exit plane of the first magnetic deflector;
    an electrostatic lens disposed in the exit plane of the first magnetic deflector;
    a second magnetic deflector substantially identical to the first magnetic deflector, wherein the second magnetic deflector is disposed for reception of the first energy dispersed electron diffraction pattern from the electrostatic lens, and configured for projection of a second non-dispersed electron diffraction pattern in a first exit plane of the second magnetic deflector; and
    an electron mirror configured for correction of one or more aberrations in the second non-dispersed electron diffraction pattern and disposed for reflection of the second non-dispersed electron diffraction pattern to the second magnetic deflector for projection of a second energy dispersed electron diffraction pattern in a second exit plane of the second magnetic deflector.

2. The aberration-correcting microscopy instrument of claim 1, wherein the exit plane of the first magnetic deflector, the second magnetic deflector, the first exit plane of the second magnetic deflector and the second exit plane of the second magnetic deflector are disposed for unit magnification.

3. The aberration-correcting microscopy instrument of claim 1, further comprising an auxiliary electrostatic lens system disposed to focus the nondispersed electron diffraction pattern onto the mirror surface for aberration correction, and to refocus it again onto the first exit plane of the second magnetic deflector after aberration correction upon return to the second magnetic deflector.

4. The aberration-correcting microscopy instrument of claim 1, further comprising an objective lens system disposed for reception of electrons, the objective lens system being configured to form an electron diffraction pattern in a backfocal plane of the objective lens system that coincides with an entrance plane for the first magnetic deflector.

5. The aberration-correcting microscopy instrument of claim 4, further comprising:
    an entrance aperture disposed in the backfocal plane of the objective lens system and entrance plane of the first magnetic deflector for filtering a slice of the electron diffraction pattern; and
    an exit aperture disposed in the second exit plane of the second magnetic deflector for selection of desired electron energy of the energy dispersed electron diffraction pattern.

6. The aberration-correcting microscopy instrument of claim 5, wherein the entrance aperture is at least one of adjustable and moveable.

7. The aberration-correcting microscopy instrument of claim 4, wherein the aberration correcting microscopy instrument comprises a low energy electron microscopy instrument and further comprising:
    an electron gun generating an electron beam at a specified electron energy;
    one or more condenser lenses disposed to receive and focus the electron beam from the electron gun into the first magnetic deflector;
    wherein the first magnetic deflector deflects the electron beam through the objective lens and onto a surface of a sample for electron reflection to the objective lens system.

8. The aberration-correcting microscopy instrument of claim 4, wherein the aberration correcting microscopy instrument comprises a photo electron emission microscopy instrument, and further comprising at least one of an ultra violet light source and a soft x-ray photon source for illumination of a sample to generate photo electrons to the objective lens system.

9. The aberration-correcting microscopy instrument of claim 1, wherein the electrostatic lens comprises an electrostatic einzel lens operating at a fixed focal length for rotation free image transfer.

10. The aberration-correcting microscopy instrument of claim 1, further comprising:
   a projection column disposed to receive and magnify at least one of an electron diffraction pattern and a real space image; and
   a viewing screen for projection of at least one of the magnified electron energy diffraction pattern and the real space image from the projection column.

11. The aberration-correcting microscopy instrument of claim 1, wherein the first magnetic deflector and second magnetic deflector each comprise a prism array having electromagnets to produce specified electron optical properties.

12. The aberration-correcting microscopy instrument of claim 11, wherein each prism array is configured to form a real space image corresponding to the electron diffraction pattern in a diagonal plane within the prism array.

13. The aberration-correcting microscopy instrument of claim 11, wherein each prism array is configured for chromatic dispersion.

14. The aberration-correcting microscopy instrument of claim 11, wherein the prism array comprises two parallel plates, perpendicular to the respective entrance and exit planes, and between which electrons are deflected, wherein each of the two parallel plates comprises a plurality of electromagnets.

15. The aberration-correcting microscopy instrument of claim 14, wherein each of the two parallel plates comprise five electromagnets.

16. The aberration-correcting microscopy instrument of claim 1, wherein the first magnetic deflector and the second magnetic deflector are configured to deflect the electron diffraction pattern approximately 90 degrees.

17. A method of aberration correction in an electron microscopy instrument, comprising the steps of:
   transferring an energy dispersed electron diffraction pattern from a first magnetic deflector to a second magnetic deflector through an electrostatic lens disposed in an exit plane of the first magnetic deflector and an entrance plane of the second magnetic deflector, wherein the second magnetic deflector is substantially identical to the first magnetic deflector;
   projecting a non-dispersed electron diffraction pattern from the second magnetic deflector to a first exit plane of the second magnetic deflector;
   reflecting the non-dispersed electron diffraction pattern in an electron mirror to correct one or more aberrations and return the nondispersed electron diffraction pattern to the second magnetic deflector; and
   projecting an energy dispersed electron diffraction pattern in a second exit plane of the second magnetic deflector.

18. The method of claim 17, further comprising the steps of:
   receiving electrons at an objective lens system, the objective lens system being capable of forming an electron diffraction pattern in a backfocal plane of the objective lens system;
   filtering a slice of the electron diffraction pattern at an entrance aperture disposed in the backfocal plane of the objective lens system;
   receiving the slice of the electron diffraction pattern at the first magnetic deflector having an entrance plane coinciding with the entrance aperture; and
   selecting a desired electron energy of the energy dispersed electron diffraction pattern at an exit aperture disposed in the second exit plane of the second magnetic deflector.

19. The method of claim 18, further comprising the step of magnifying an energy filtered, aberration corrected image onto a viewing screen.

20. The method of claim 18, further comprising the step of magnifying an energy filtered diffraction pattern onto a viewing screen.

21. The method of claim 18, further comprising the step of magnifying a dispersed energy spectrum on a viewing screen.

* * * * *